(12) United States Patent
Suzuki et al.

(10) Patent No.: US 11,453,031 B2
(45) Date of Patent: Sep. 27, 2022

(54) ULTRASONIC ELEMENT AND ULTRASONIC DEVICE

(71) Applicant: Seiko Epson Corporation, Tokyo (JP)

(72) Inventors: Hironori Suzuki, Chino (JP); Chikara Kojima, Matsumoto (JP); Koji Ohashi, Matsumoto (JP); Yasuyuki Matsumoto, Azumino (JP); Katsuhiro Imai, Minowa (JP)

(73) Assignee: Seiko Epson Corporation

( * ) Notice: Subject to any disclaimer, the term of this patent is extended or adjusted under 35 U.S.C. 154(b) by 380 days.

(21) Appl. No.: 16/660,847

(22) Filed: Oct. 23, 2019

(65) Prior Publication Data

US 2020/0130014 A1 Apr. 30, 2020

(30) Foreign Application Priority Data

Oct. 24, 2018 (JP) .............................. JP2018-200018

(51) Int. Cl.
*B06B 1/06* (2006.01)
*H01L 41/047* (2006.01)
(Continued)

(52) U.S. Cl.
CPC .......... *B06B 1/0681* (2013.01); *B06B 1/0215* (2013.01); *B06B 1/0629* (2013.01);
(Continued)

(58) Field of Classification Search
CPC ... B06B 1/0681; B06B 1/0629; H01L 41/042; H01L 41/0475; H01L 41/0533; H01L 41/0825
(Continued)

(56) References Cited

U.S. PATENT DOCUMENTS 9,705,066 B2 7/2017 Hamaguchi et al.
2015/0258573 A1* 9/2015 Kojima ................ B06B 1/0622
310/327
(Continued)

FOREIGN PATENT DOCUMENTS

CN 105966068 A 9/2016
JP 2018-085612 A 5/2018
(Continued)

*Primary Examiner* — Derek J Rosenau
(74) *Attorney, Agent, or Firm* — Harness, Dickey & Pierce, P.L.C.

(57) ABSTRACT

An ultrasonic element includes an element substrate including a first surface, a second surface having a front-back relation with the first surface, an opening section piercing through the element substrate from the first surface to the second surface, and a partition wall section surrounding the opening section, a supporting film provided on the first surface of the element substrate to cover the opening section and including a third surface facing the opening section and a fourth surface having a front-back relation with the third surface, a piezoelectric element provided on the fourth surface of the supporting film and disposed in a region overlapping the opening section of the supporting film in a plan view from a film thickness direction extending from the third surface to the fourth surface, a sealing plate provided to be opposed to the fourth surface of the supporting film and joined to the supporting film by an adhesive member via a beam section projecting toward the supporting film, and a wall section provided on the fourth surface of the supporting film and provided to project toward the sealing plate between the beam section and the piezoelectric element.

5 Claims, 10 Drawing Sheets

(51) Int. Cl.
　　　*H01L 41/053*　　　(2006.01)
　　　*B06B 1/02*　　　(2006.01)
　　　*H01L 41/23*　　　(2013.01)
　　　*H01L 41/08*　　　(2006.01)
　　　*H01L 41/04*　　　(2006.01)

(52) U.S. Cl.
　　　CPC ........ *H01L 41/042* (2013.01); *H01L 41/0475* (2013.01); *H01L 41/0533* (2013.01); *H01L 41/0825* (2013.01); *H01L 41/23* (2013.01)

(58) Field of Classification Search
　　　USPC .................................................. 310/322, 334
　　　See application file for complete search history.

(56) References Cited

U.S. PATENT DOCUMENTS

| | | |
|---|---|---|
| 2016/0263890 A1 | 9/2016 | Hamaguchi et al. |
| 2017/0028440 A1* | 2/2017 | Kiyose .................. H01L 41/313 |
| 2018/0192995 A1 | 7/2018 | Osawa et al. |

FOREIGN PATENT DOCUMENTS

| | | |
|---|---|---|
| JP | 2018-085636 A | 5/2018 |
| JP | 2018-110360 A | 7/2018 |

\* cited by examiner

ULTRASONIC ELEMENT AND ULTRASONIC DEVICE

The present application is based on, and claims priority from, JP Application Serial Number 2018-200018, filed Oct. 24, 2018, the disclosure of which is hereby incorporated by reference herein in its entirety.

BACKGROUND

1. Technical Field

The present disclosure relates to an ultrasonic element and an ultrasonic device.

2. Related Art

There has been known an ultrasonic element in which a supporting film covering an opening section is provided on one surface side of a substrate including the opening section and a piezoelectric element is disposed on the supporting film in a position corresponding to the opening section (see, for example, JP A-2018-110360 (Patent Literature 1)).

In the ultrasonic element described in Patent Literature 1, a sealing plate is joined to a surface on the opposite side of the substrate of the supporting film via a beam section. Consequently, a cavity is formed by the supporting film, the beam section, and the sealing plate to secure a region where the piezoelectric element is vibrated.

However, in the ultrasonic element described in Patent Literature 1, when the beam section of the sealing plate and the supporting film are joined by an adhesive, the adhesive sometimes flows out to reach the piezoelectric element. If the adhesive adheres to the piezoelectric element, a vibration characteristic of the piezoelectric element changes. Therefore, a desired acoustic characteristic cannot be obtained.

SUMMARY

An ultrasonic element according to an application example of the present disclosure includes: an element substrate including a first surface, a second surface having a front-back relation with the first surface, an opening section piercing through the element substrate from the first surface to the second surface, and a partition wall section surrounding the opening section; a supporting film provided on the first surface of the element substrate to cover the opening section and including a third surface facing the opening section and a fourth surface having a front-back relation with the third surface; a piezoelectric element provided on the supporting film and disposed in a region overlapping the opening section of the supporting film in a plan view from a film thickness direction extending from the third surface to the fourth surface; a sealing plate provided to be opposed to the fourth surface of the supporting film and joined to the supporting film by an adhesive member via a beam section projecting toward the supporting film; and a wall section provided on the fourth surface of the supporting film and provided to project toward the sealing plate between the beam section and the piezoelectric element.

In the ultrasonic element according to the application example, the adhesive member may be disposed from the beam section to the wall section.

In the ultrasonic element according to the application example, the ultrasonic element may include a supporting wall provided on the fourth surface of the supporting film and projecting toward the beam section, and the beam section and the supporting wall may be joined by the adhesive member.

In the ultrasonic element according to the application example, the ultrasonic element may include a bypass wire coupled to the piezoelectric element, and the wall section is configured by a part of the bypass wire.

An ultrasonic device according to an application example of the present disclosure includes: the ultrasonic element according to the application example explained above; and a driving circuit configured to input a driving signal to the piezoelectric element.

DESCRIPTION OF EXEMPLARY EMBODIMENTS

First Embodiment

Figure 1:
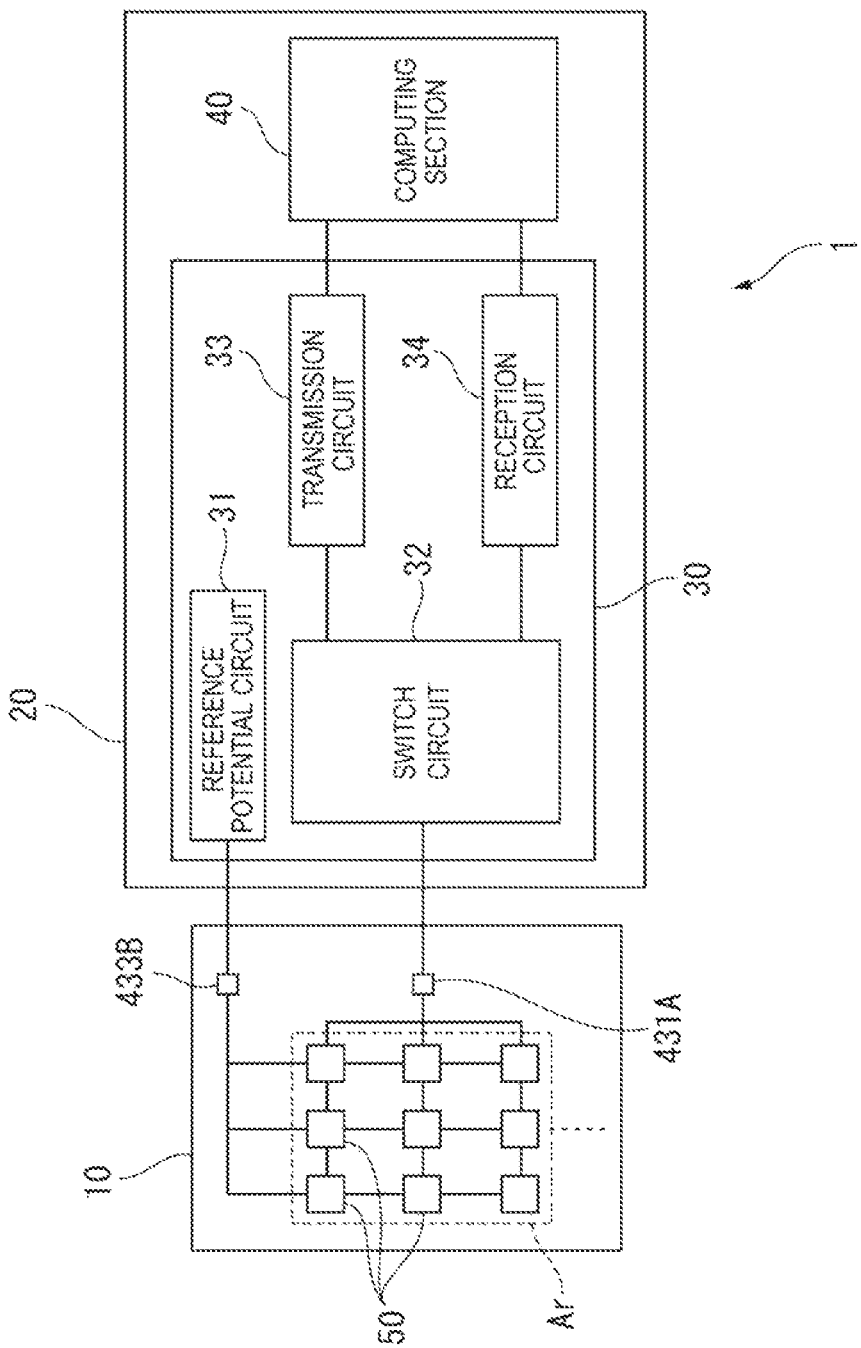
FIG. 1 is a block diagram showing a schematic configuration of a distance measuring device, which is an example of an ultrasonic device in a first embodiment.

FIG. 1 is a block diagram showing a schematic configuration of a distance measuring device 1, which is an example of an ultrasonic device in a first embodiment.

As shown in FIG. 1, the distance measuring device 1 in this embodiment includes an ultrasonic element 10 and a control section 20 that controls the ultrasonic element 10. In the distance measuring device 1, the control section 20 controls the ultrasonic element 10 via a driving circuit 30 and transmits ultrasound from the ultrasonic element 10. When the ultrasound is reflected by an object and reflected wave is received by the ultrasonic element 10, the control section 20 calculates a distance from the ultrasonic element 10 to the object based on a time from transmission timing of the ultrasound to reception timing of the ultrasound.

The configuration of such a distance measuring device 1 is specifically explained below.

Configuration of the Ultrasonic Element 10

Figure 2:
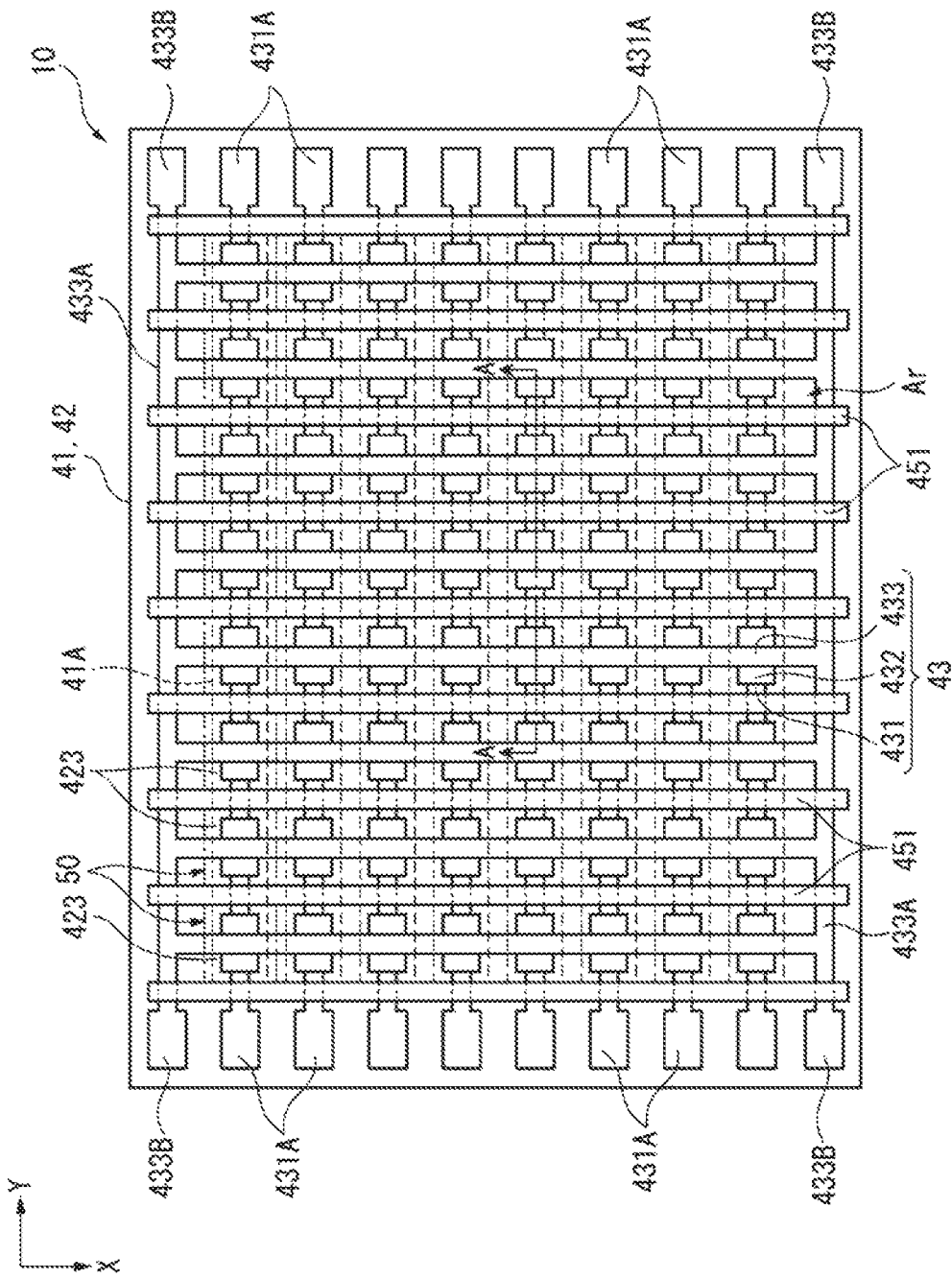
FIG. 2 is a plan view schematically showing the configuration of an ultrasonic element in the first embodiment.

FIG. 2 is a plan view schematically showing an overview of the ultrasonic element 10.

As shown in FIG. 2, pluralities of ultrasonic transducers 50 are disposed in a two-dimensional array shape along an X direction and a Y direction crossing each other. In an example shown in FIG. 2, the X direction and the Y direction are orthogonal. In FIG. 2, illustration of the sealing plate 45 is omitted.

In this embodiment, a transmission and reception row element group of one channel is configured by the plurality of ultrasonic transducers 50 disposed in the Y direction. A plurality of the transmission and reception row element groups of the one channel are disposed along the X direction, whereby the ultrasonic element 10 of a one-dimensional array structure is configured. A region where the ultrasonic transducers 50 are disposed is referred to as array region Ar.

In FIG. 2, for convenience of explanation, the number of disposed ultrasonic transducers 50 is reduced. However, actually, a larger number of ultrasonic transducers 50 are disposed.

Figure 3:
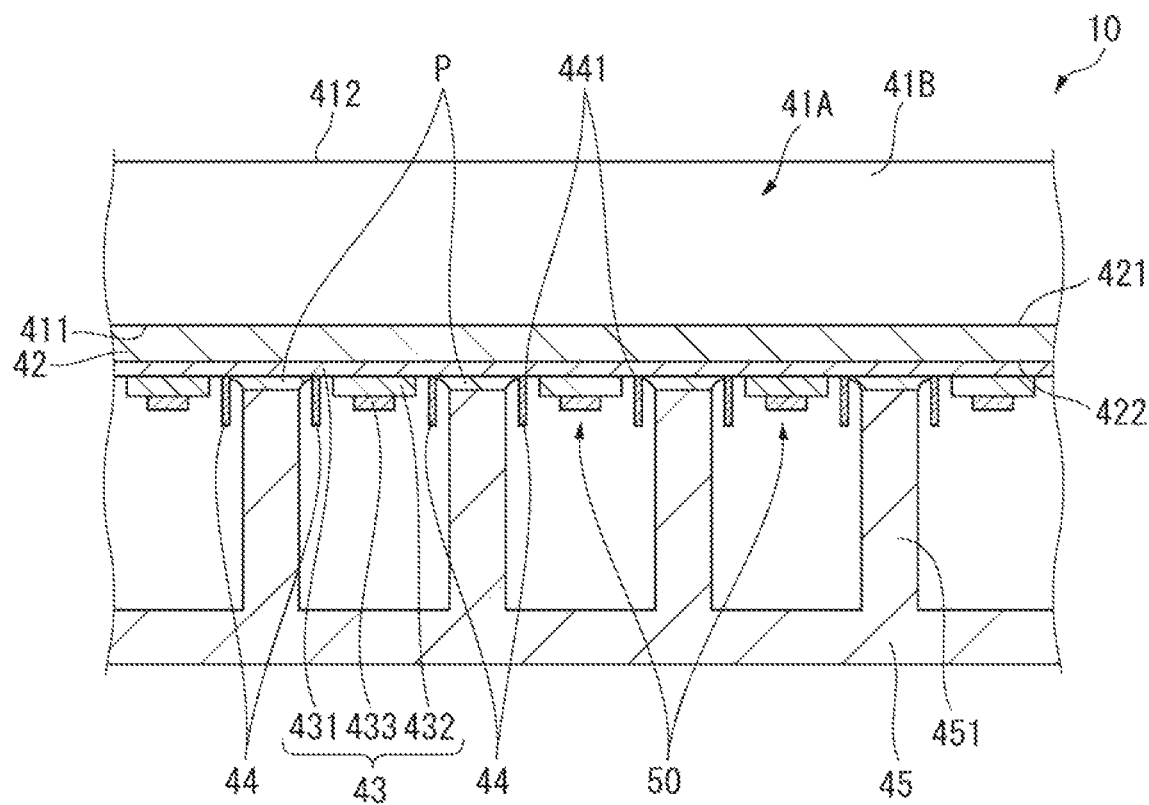
FIG. 3 is a sectional view schematically showing the ultrasonic element taken along an A-A line in FIG. 2.
Figure 4:
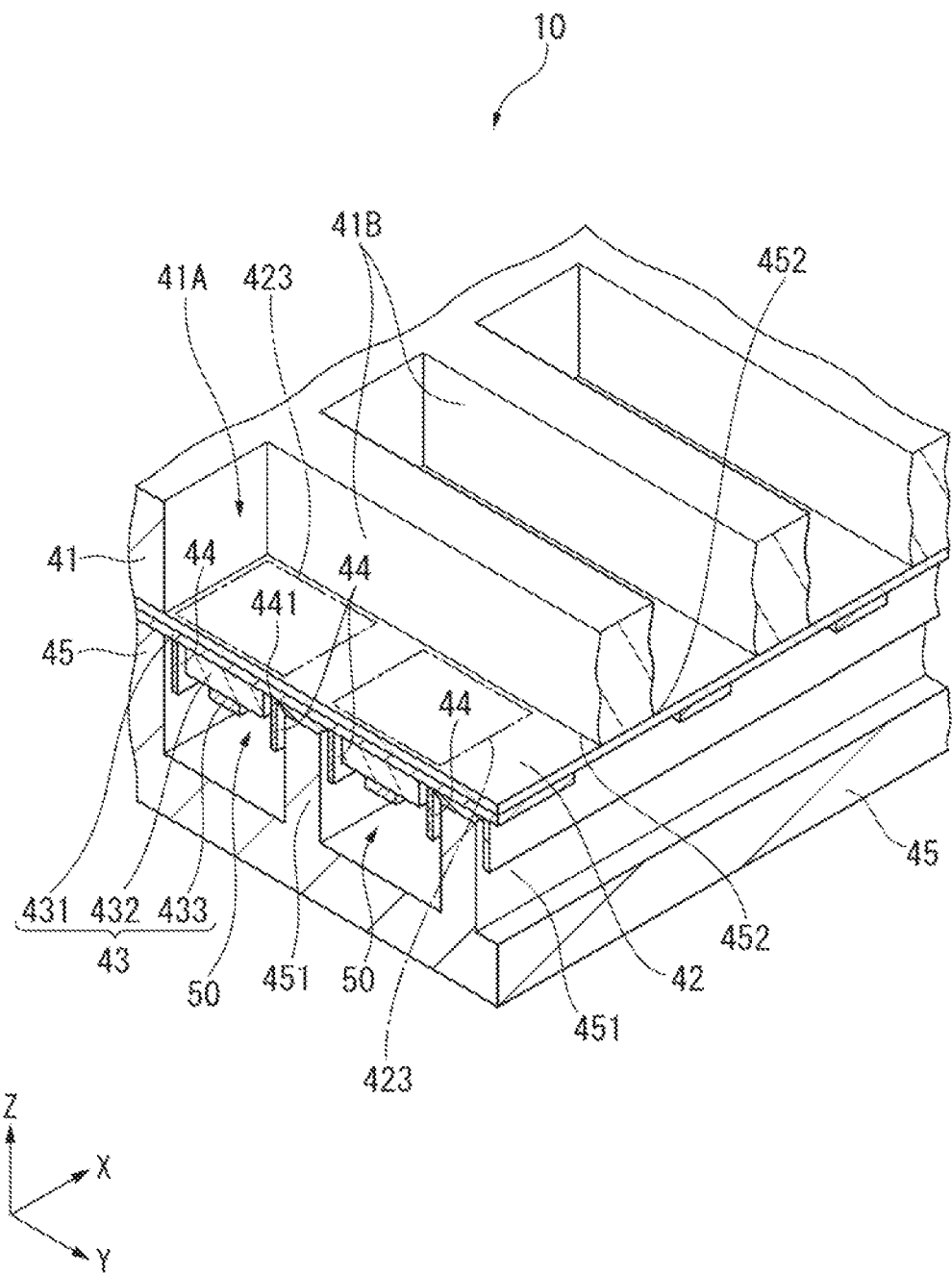
FIG. 4 is a sectional perspective view schematically showing an overview of the ultrasonic element in the first embodiment.

FIG. 3 is a sectional view schematically showing the ultrasonic element 10 taken along an A-A line in FIG. 2. FIG. 4 is a sectional perspective view schematically showing an overview of the ultrasonic element 10.

As shown in FIGS. 3 and 4, the ultrasonic element 10 includes an element substrate 41, a supporting film 42, piezoelectric elements 43, wall sections 44, and a sealing plate 45.

Configuration of the Element Substrate 41

The element substrate 41 includes a first surface 411 and a second surface 412 having a front-back relation with the first surface 411. The element substrate 41 is configured by a semiconductor substrate of Si or the like. In this embodiment, a plurality of opening sections 41A longitudinal in the Y direction are provided on the element substrate 41 in the X direction.

The opening sections 41A are through-holes piercing through the element substrate 41 from the first surface 411 to the second surface 412. The supporting film 42 is provided on the first surface 411 side of the through-holes. That is, the first surface 411 side of the opening sections 41A is covered by the supporting film 42. Resin or the like may be filled in the opening sections 41A to form vibration suppressing layers in order to suppress the influence of crosstalk.

Portions of the element substrate 41 joined to the supporting film 42 are partition wall sections 41B. The opening sections 41A are formed by being surrounded in four directions on ±X sides and ±Y sides by the partition wall sections 41B. Accordingly, the partition wall sections 41B on the ±X sides are opposed to each other in the X direction and the partition wall sections 41B on the ±Y sides are opposed to each other in the Y direction.

Configuration of the Supporting Film 42

The supporting film 42 is configured by, for example, a laminated body of $SiO_2$ and $ZrO_2$ and includes a third surface 421 facing the opening sections 41A of the element substrate 41 and a fourth surface 422, which is the rear surface of the third surface 421. That is, the supporting film 42 is supported by the partition wall sections 41B configuring the opening sections 41A and covers the first surface 411 side of the opening sections 41A. A thickness dimension of the supporting film 42 is a sufficiently small thickness dimension with respect to the element substrate 41.

Configuration of the Sealing Plate 45

The sealing plate 45 has a function of reinforcing the element substrate 41. A plane shape of the sealing plate 45 viewed from the thickness direction thereof is formed in, for example, the same shape as the element substrate 41. The sealing plate 45 is configured by a semiconductor substrate of Si or the like or an insulator substrate. On the sealing plate 45, beam sections 451 projecting from a surface opposed to the element substrate 41 toward the supporting film 42 are provided. The sealing plate 45 is joined to the supporting film 42 by adhesive members P via the beam sections 451. The beam sections 451 is formed integrally with the sealing plate 45 by etching or the like and provided between ±X-side end portions in the array region Ar.

Configuration of the Wall Sections 44

The wall sections 44 suppress, when the adhesive members P joining the supporting film 42 and the beam sections 451 flow out along the fourth surface 422 of the supporting film 42, the adhesive members P from reaching the piezoelectric elements 43. In this embodiment, the adhesive members P are disposed from the beam sections 451 to the wall sections 44. Consequently, vibration of the supporting film 42 is suppressed because the adhesive members P are solidified in regions between the beam sections 451 and the wall sections 44.

The wall sections 44 are formed of, for example, resin and are provided to project toward the sealing plate between the beam sections 451 and the piezoelectric elements 43 on the fourth surface 422 side of the supporting film 42 by etching or the like. The X direction is set as the longitudinal direction of the wall sections 44. A plurality of wall sections 44 are provided in the Y direction. In this embodiment, the wall sections 44 are formed between the ±X-side end portions in the array region Ar.

In such a configuration, the supporting film 42 covering the opening sections 41A of the element substrate 41 is partitioned into vibrating sections 423 functioning as a plurality of vibration regions by edges 452 of the partition wall sections 41B configuring the opening sections 41A and edges 441 on the piezoelectric elements 43 side of the wall sections 44 in a plan view from a film thickness direction extending from the third surface 421 toward the fourth surface 422.

Specifically, at ±Y-side end portions of the opening section 41A, a region of the supporting film 42 surrounded by an edge 452 of one partition wall section 41B extending in the X direction, two edges 452 opposed to each other of a pair of partition wall sections 41B extending in the Y direction, and an edge 441 of one wall section 44 extending in the X direction is the vibrating section 423. In portions other than the end portions of the opening section 41A, a region of the supporting film 42 surrounded by two edges 452 opposed to each other of the pair of partition wall sections 41B extending in the Y direction and two edges 441 opposed to each other of the pair of wall sections 44 extending in the X direction is the vibrating section 423.

Configuration of the Piezoelectric Elements 43

The piezoelectric elements 43 are respectively provided in the vibrating sections 423 on the fourth surface 422 side of the supporting film 42. Each of the piezoelectric elements 43 is configured by, for example, a laminated body obtained by laminating a lower electrode 431, a piezoelectric film 432, and an upper electrode 433 in order from the supporting film 42 side. That is, the piezoelectric element 43 is disposed in a region overlapping the opening section 41A of the supporting film 42 in the plan view from the film thickness direction extending from the third surface 421 toward the fourth surface 422 of the supporting film 42. The lower electrode 431 is an example of a first electrode. The upper electrode 433 is an example of a second electrode.

In such an ultrasonic transducer 50, a rectangular wave voltage having a predetermined frequency, that is, a driving signal is applied between the lower electrode 431 and the upper electrode 433, whereby the piezoelectric film 432 bends, the vibrating section 423 vibrates, and ultrasound is transmitted. When the vibrating section 423 is vibrated by the ultrasound reflected from the object, a potential difference occurs between above and below the piezoelectric film 432. Consequently, it is possible to detect the received ultrasound by detecting the potential difference that occurs between the lower electrode 431 and the upper electrode 433.

In this embodiment, as shown in FIG. 2, the lower electrode 431 is linearly formed along the Y direction. The lower electrode 431 couples the plurality of ultrasonic transducers 50 configuring the transmission and reception row element group of one channel. Driving terminals 431A are provided at both end portions of the lower electrode 431.

The upper electrode 433 is linearly formed along the X direction. The upper electrode 433 couples the ultrasonic transducers 50 disposed in the X direction. ±Y-side end portions of the upper electrode 433 are coupled to the common electrode line 433A. The common electrode line 433A couples a plurality of upper electrodes 433 disposed in the X direction. Common electrodes 433B electrically coupled to a circuit board are provided at end portions of the common electrode line 433A.

The driving terminals 431A and the common terminals 433B are respectively coupled to the driving circuit 30. A driving signal is input to the driving terminals 431A from the driving circuit 30. Predetermined common potential, for example, −3 V is applied to the common electrodes 433B.

When ultrasound is transmitted from the ultrasonic element 10, as explained above, the common potential is applied to the upper electrode 433 and the driving signal is input to the lower electrode 431. Since the driving terminals 431A are provided to correspond to respective transmission and reception section element groups as shown in FIG. 2, it is possible to independently input the driving signal to the transmission and reception section element groups. Therefore, by selecting the driving terminal 431A to which the driving signal is input from the driving circuit 30, it is possible to drive the transmission and reception section element groups with a lag time, simultaneously drive the transmission and reception section element groups, and individually drive the transmission and reception section element groups.

Configuration of the Control Section 20

The control section 20 includes a driving circuit 30 that drives the ultrasonic element 10 and a computing section 40. Besides, the control section 20 may include a storing section storing various data, various computer programs, and the like for controlling the distance measuring device 1.

The driving circuit 30 is a driver circuit for controlling the driving of the ultrasonic element 10. For example, as shown in FIG. 1, the driving circuit 30 includes a reference potential circuit 31, a switch circuit 32, a transmission circuit 33, and a reception circuit 34.

The reference potential circuit 31 is coupled to the common terminal 433B of the upper electrode 433 of the ultrasonic element 10. The reference potential circuit 31 applies reference potential, for example, −3 V to the upper electrode 433.

The switch circuit 32 is coupled to the driving terminals 431A of the lower electrodes 431 of the ultrasonic transducers 50 disposed in the array region Ar, the transmission circuit 33, and the reception circuit 34. The switch circuit 32 is configured by a switching circuit. The switch circuit 32 switches transmission coupling for coupling each of the driving terminals 431A and the transmission circuit 33 and reception coupling for coupling each of the driving terminals 431A and the reception circuit 34.

The transmission circuit 33 is coupled to the switch circuit 32 and the computing section 40. When the switch circuit 32 is switched to the transmission coupling, the transmission circuit 33 outputs, based on control by the computing section 40, a driving signal having a pulse waveform to the ultrasonic transducers 50 in the array region Ar and causes the ultrasonic element 10 to transmit ultrasound.

Manufacturing Method of the Ultrasonic Element 10

A manufacturing method of the ultrasonic element 10 explained above is explained.

Figure 5:
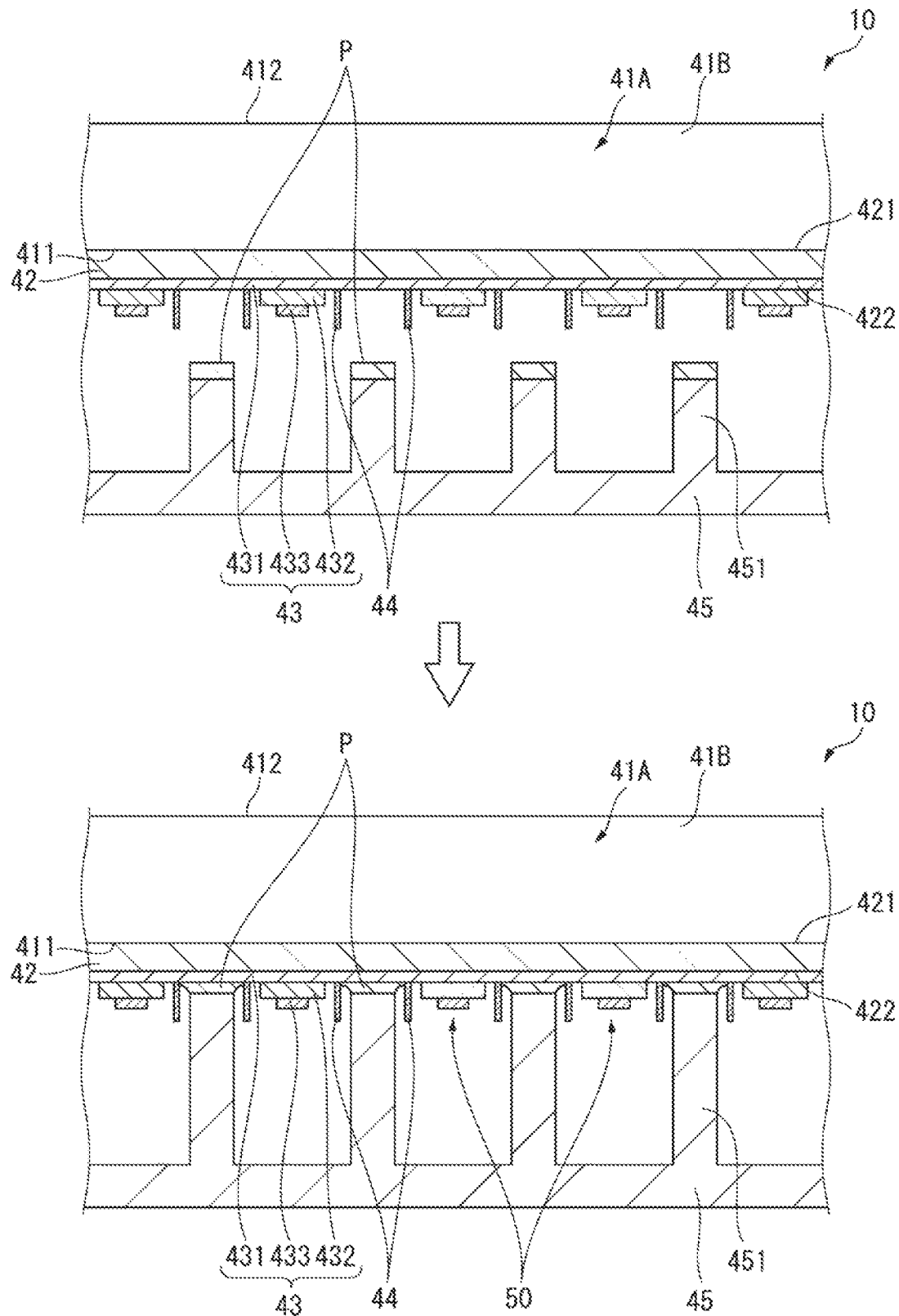
FIG. 5 is a diagram showing an overview of a manufacturing process of the ultrasonic element in the first embodiment.

FIG. 5 is a diagram showing an overview of a manufacturing process of the ultrasonic element 10 in this embodiment.

As shown in FIG. 5, to manufacture the ultrasonic element 10, first, the element substrate 41 and the sealing plate 45 are manufactured.

Specifically, one surface side of a semiconductor substrate of Si is subjected to thermal oxidation treatment to form an $SiO_2$ film on the surface of the semiconductor substrate. Further, a Zr layer is formed on the $SiO_2$ film and is subjected to thermal oxidation processing to form a $ZrO_2$ layer. The supporting film 42 is formed by a laminated body of $SiO_2$ and $ZrO_2$. The piezoelectric elements 43 and the wall sections 44 are formed on the supporting film 42. Thereafter, the element substrate 41 including the opening sections 41A is formed by etching the other surface side of the semiconductor substrate.

The sealing plate 45 including the beam sections 451 is formed by etching another semiconductor substrate.

Subsequently, the adhesive members P are transferred onto the surfaces of the beam sections 451 opposed to the supporting film 42. The beam sections 451 and the supporting film 42 are joined by the adhesive members P.

In this case, as shown in FIG. 5, even if the adhesive members P flow out along the fourth surface 422 of the supporting film 42, the adhesive members P are dammed by the wall sections 44. That is, the adhesive members P are disposed between the beam sections 451 and the wall sections 44. Consequently, it is possible to suppress the flowing-out adhesive members P from reaching the piezoelectric elements 43. Therefore, it is possible to suppress the adhesive members P from adhering to the piezoelectric elements 43 to change a vibration characteristic of the piezoelectric elements 43.

Action Effects of this Embodiment

The ultrasonic element 10 in this embodiment includes the element substrate 41 including the first surface 411 and the second surface 412, the opening sections 41A piercing through the element substrate 41 from the first surface 411 to the second surface 412, and the partition wall sections 41B that surround the opening sections 41A. On the first surface 411 of the element substrate 41, the supporting film 42 covering the opening sections 41A and including the third surface 421 facing the opening sections 41A and the fourth surface 422 having a front-back relation with the third surface 421 is provided. The beam sections 451 projecting from the sealing plate 45 toward the supporting film 42 are joined to the fourth surface 422 of the supporting film 42 by the adhesive members P. On the fourth surface 422 of the supporting film 42, the wall sections 44 projecting toward the sealing plate 45 are provided between the beam sections 451 and the piezoelectric elements 43. Consequently, when the beam sections 451 and the supporting film 42 are joined by the adhesive members P, even if the adhesive members P flow out along the fourth surface 422 of the supporting film 42, the adhesive members P are dammed by the wall sections 44. Therefore, it is possible to suppress the flowing-out adhesive members P from reaching the piezoelectric elements 43. It is possible to suppress the adhesive members P from adhering to the piezoelectric element 43 to prevent a desired acoustic characteristic from not being obtained.

In this embodiment, the adhesive members P are disposed from the beam sections 451 to the wall sections 44.

When the adhesive members P do not reach the wall sections 44 and stop between the beam sections 451 and the wall sections 44, frequencies of the ultrasonic transducers fluctuate depending on end portion positions of the flowing-out adhesive members P. That is, when the adhesive members P solidify, the vibration of the supporting film 42 is suppressed. Therefore, frequency characteristics of the ultrasonic transducers 50 are determined by portions to which the adhesive members P do not adhere. However, when the beam sections 451 are bonded to the supporting film 42, an amount of the adhesive members P flowing out to between the beam sections 451 and the wall sections 44 fluctuates according to a slight alignment error. Therefore, the frequency characteristics of the ultrasonic transducers 50 are characteristics different from one another.

On the other hand, in this embodiment, the adhesive members P are disposed from the beam sections 451 to the wall sections 44. That is, the adhesive members P reach the wall sections 44 to be solidified. Consequently, the vibration regions can defined by the edges 441 of the wall sections 44. It is possible to uniformize the frequency characteristics of the ultrasonic transducers 50.

Second Embodiment

A second embodiment of the present disclosure is explained.

In the first embodiment explained above, the example is explained in which the beam sections 451 and the supporting film 42 are joined by the adhesive members P. The second embodiment is different from the first embodiment in that supporting walls 46 projecting toward the beam sections 451 are provided on the fourth surface 422 of the supporting film 42 and the supporting walls 46 and the beam sections 451 are joined by the adhesive members P.

Figure 6:
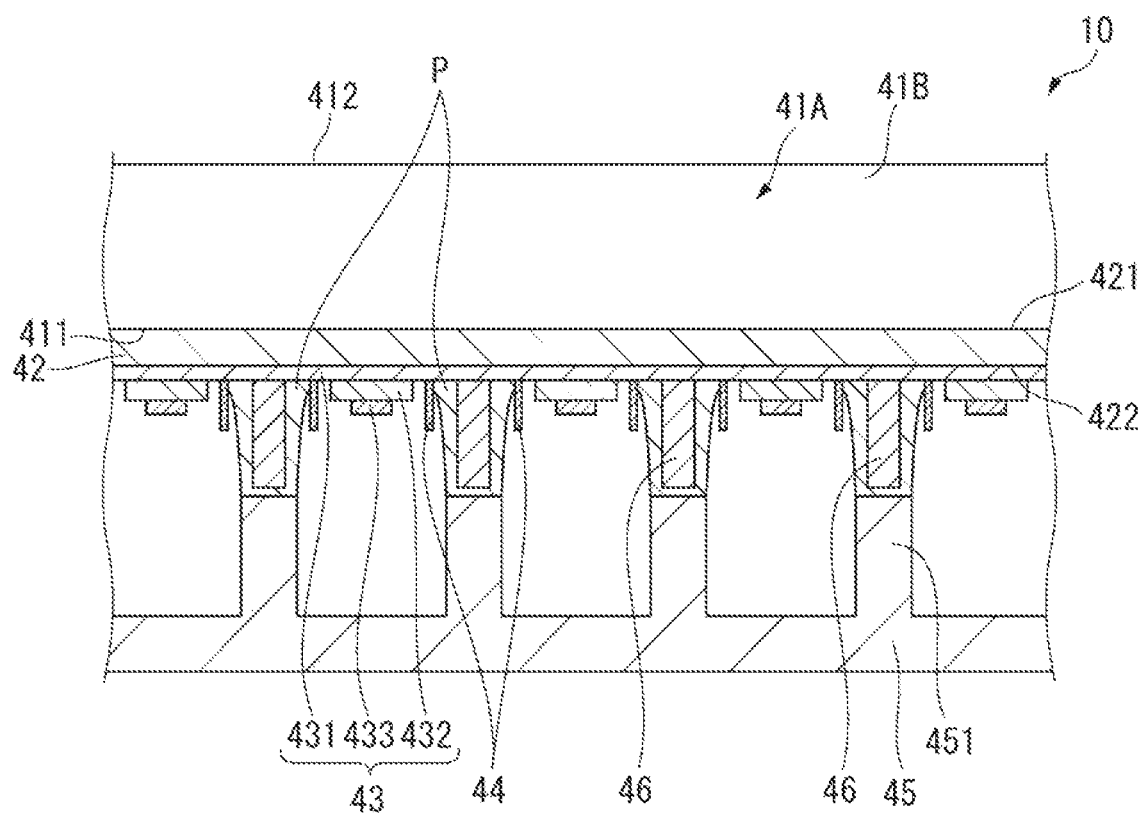
FIG. 6 is a sectional view schematically showing an overview of an ultrasonic element in a second embodiment.

FIG. 6 is a sectional view schematically showing the ultrasonic element 10 in the second embodiment.

As shown in FIG. 6, in this embodiment, the supporting walls 46 projecting toward the beam sections 451 are formed on the fourth surface 422 side of the supporting film 42.

The supporting walls 46 are formed of, for example, resin and are provided on the fourth surface 422 side of the supporting film 42 by etching or the like. The X direction is set as the longitudinal direction of the supporting walls 46. A plurality of the supporting walls 46 are provided in the Y direction. In this embodiment, the supporting walls 46 are formed between the ±x-side end portions in the array region Ar. The supporting walls 46 and the beam sections 451 are joined by the adhesive members P.

In such a configuration, when the supporting walls 46 and the beam sections 451 are joined and the adhesive members P flow out, the flowing-out adhesive members P move along the wall surfaces of the supporting walls 46. Thereafter, after moving along the fourth surface 422 of the supporting film 42, the flowing-out adhesive members P are dammed by the wall sections 44. That is, the flowing-out adhesive members P are disposed on the wall surfaces of the supporting walls 46 and between the supporting walls 46 and the wall sections 44. Therefore, it is possible to more surely suppress the flowing-out adhesive members P from reaching the piezoelectric elements 43.

Action Effects of this Embodiment

The ultrasonic element 10 in this embodiment includes the supporting walls 46 provided on the fourth surface 422 of the supporting film 42 and projecting toward the beam sections 451. The supporting walls 46 and the beam sections 451 are joined by the adhesive members P. In this case, the adhesive members P move along the wall surfaces of the supporting walls 46. Thereafter, after moving along the fourth surface 422 of the supporting film 42, the adhesive members P reach the wall sections 44. Therefore, it is possible to more surely suppress the flowing-out adhesive members P from flowing out further to the piezoelectric elements 43 side than the wall sections 44.

Third Embodiment

A third embodiment of the present disclosure is explained.

In the first and second embodiments explained above, the example is explained in which the wall sections 44 projecting toward the sealing plates 45 are provided on the fourth surface 422 side of the supporting film 42. The third embodiment is different from the first and second embodiments in that the wall sections 44 are configured as a part of lower electrode coupling wires 431C.

Figure 7:
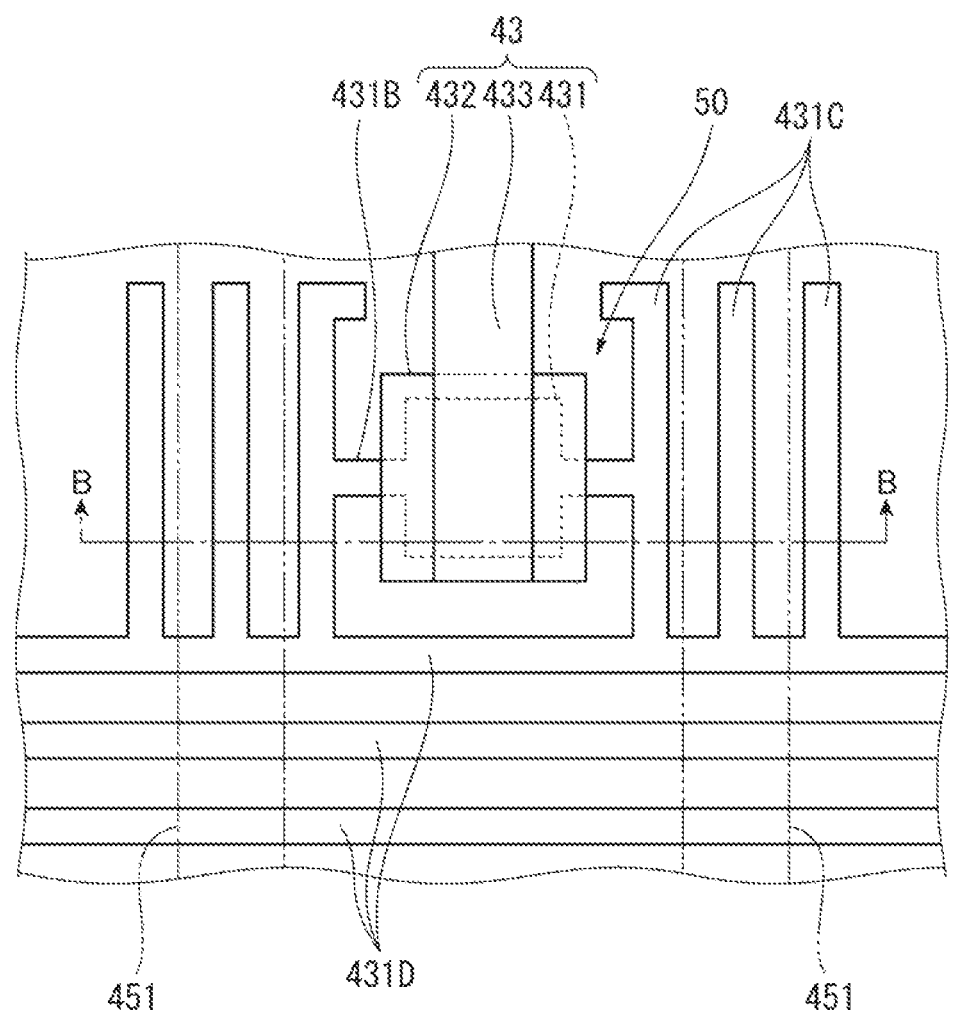
FIG. 7 is an enlarged plan view of one of ultrasonic transducers in an ultrasonic element in a third embodiment.
Figure 8:
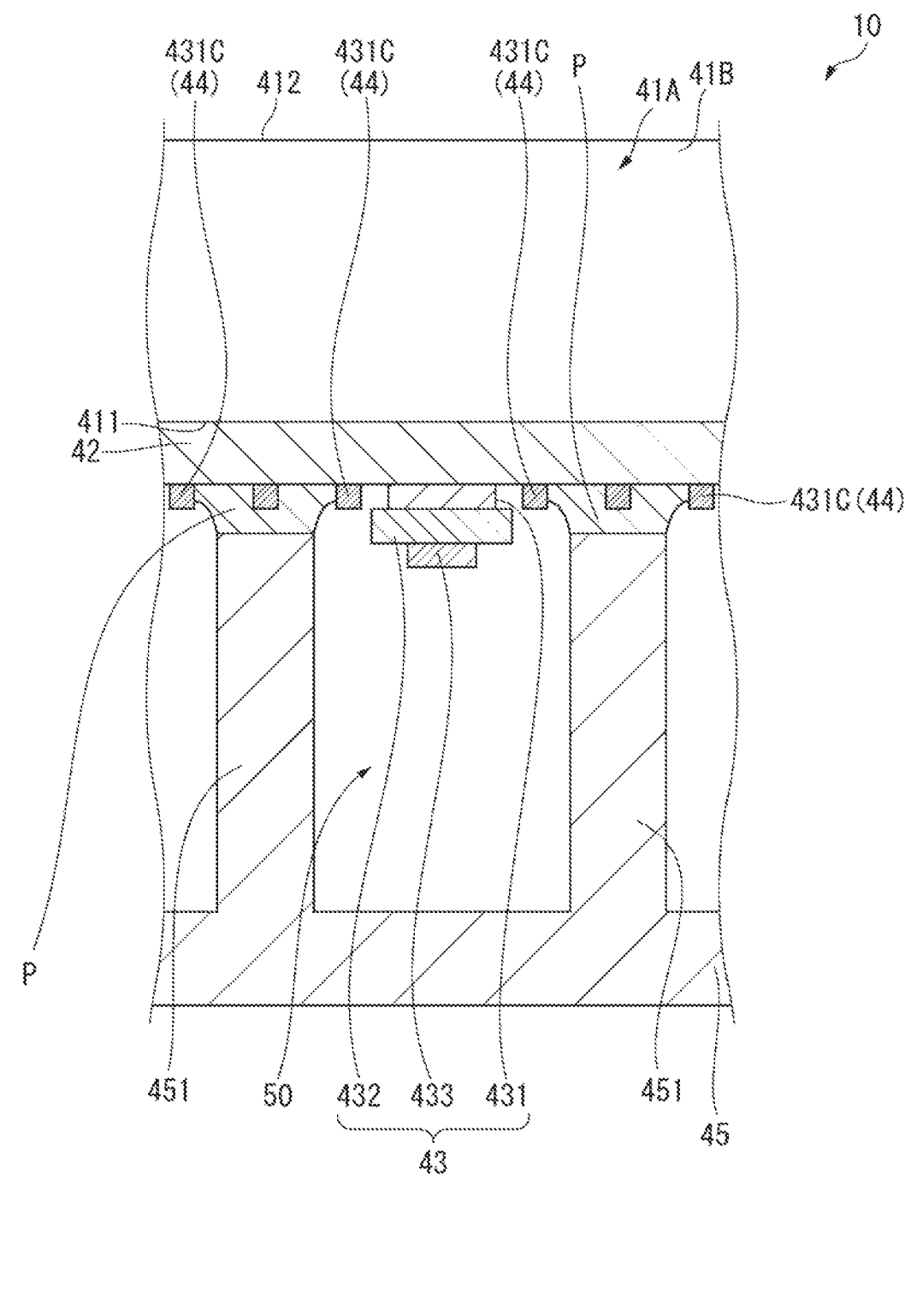
FIG. 8 is a sectional view schematically showing the ultrasonic element taken along a B-B line in FIG. 7.

FIG. 7 is an enlarged plan view of one of the ultrasonic transducers 50 in the ultrasonic element 10 in the third embodiment. FIG. 8 is a sectional view schematically showing the ultrasonic element 10 taken along a B-B line in FIG. 7.

As shown in FIGS. 7 and 8, lower electrode draw-out wires 431B, lower electrode coupling wires 431C, and lower electrode coupling wires 431D are coupled to the lower electrode 431. Consequently, the respective lower electrodes 431 of the ultrasonic transducers 50 are electrically coupled via the lower electrode draw-out wires 431B, the lower electrode coupling wires 431C, and the lower electrode coupling wires 431D.

The lower electrode draw-out wires 431B are formed of a conductive material and extended in a +Y direction and a –Y direction from the lower electrode 431.

The lower electrode coupling wires 431C are formed of a conductive material and coupled to the lower electrode draw-out wires 431B and the lower electrode coupling wires 431D. The lower electrode coupling wires 431C are extended in the X direction on a +Y side and a –Y side of the piezoelectric elements 43. That is, the lower electrode coupling wires 431C are disposed to be opposed to each other across the piezoelectric elements 43 in the Y direction. The lower electrode coupling wires 431C are configured as bundle wires obtained by binding a plurality of wires. In this embodiment, the lower electrode coupling wires 431C are configured by binding three wires.

The lower electrode coupling wires 431D are formed of a conductive material and coupled to the lower electrode coupling wires 431C. The lower electrode coupling wires 431D are configured as bundle wires obtained by binding a plurality of wires. In this embodiment, the lower electrode coupling wires 431D are configured by binding three wires. The lower electrode coupling wires 431D are coupled to the driving terminals 431A at end portions in the ±Y directions.

As shown in FIG. 8, in a sectional view from the X direction, among the lower electrode coupling wires 431C configured by the three wires, the lower electrode coupling wires 431C disposed on both sides in the ±Y directions are disposed between the beam sections 451 and the piezoelectric element 43. Consequently, when the beam sections 451 and the supporting film 42 are joined by the adhesive members P, even if the adhesive members P flow out along the fourth surface 422 of the supporting film 42, the adhesive members P are dammed by the lower electrode coupling wires 431C. In this way, in this embodiment, the wall sections 44 that dam the flowing-out adhesive members P are configured as a part of the lower electrode coupling wires 431C. That is, the lower electrode coupling wires 431C are an example of a bypass wire.

Action Effects of this Embodiment

In the ultrasonic element 10 in this embodiment, the piezoelectric element 43 includes the lower electrode 431, the piezoelectric film 432, and the upper electrode 433 laminated from the supporting film 42. A part of the lower electrode coupling wires 431C disposed between the beam sections 451 and the piezoelectric element 43 and electrically coupled to the lower electrode 431 are configured as the wall sections 44. Consequently, for example, even if the wall sections 44 are not provided by, for example, etching resin, it is possible to suppress the flowing-out adhesive members P from reaching the piezoelectric element 43. Therefore, it is possible to facilitate manufacturing of the ultrasonic element 10.

Modifications

The present disclosure is not limited to the embodiments explained above. Modifications and improvements in a range in which the object of the present disclosure can be achieved and configurations obtained by, for example, combining the embodiments as appropriate are included in the present disclosure.

In the first and second embodiments, the example is explained in which the piezoelectric element 43 is provided on the fourth surface 422 side of the supporting film 42. However, the present disclosure is not limited to this. For example, the piezoelectric element 43 may be provided on the third surface 421 side of the supporting film 42.

In the third embodiment, the example is explained in which a part of the lower electrode coupling wires 431C are configured as the wall sections 44. However, the present disclosure is not limited to this.

Figure 9:
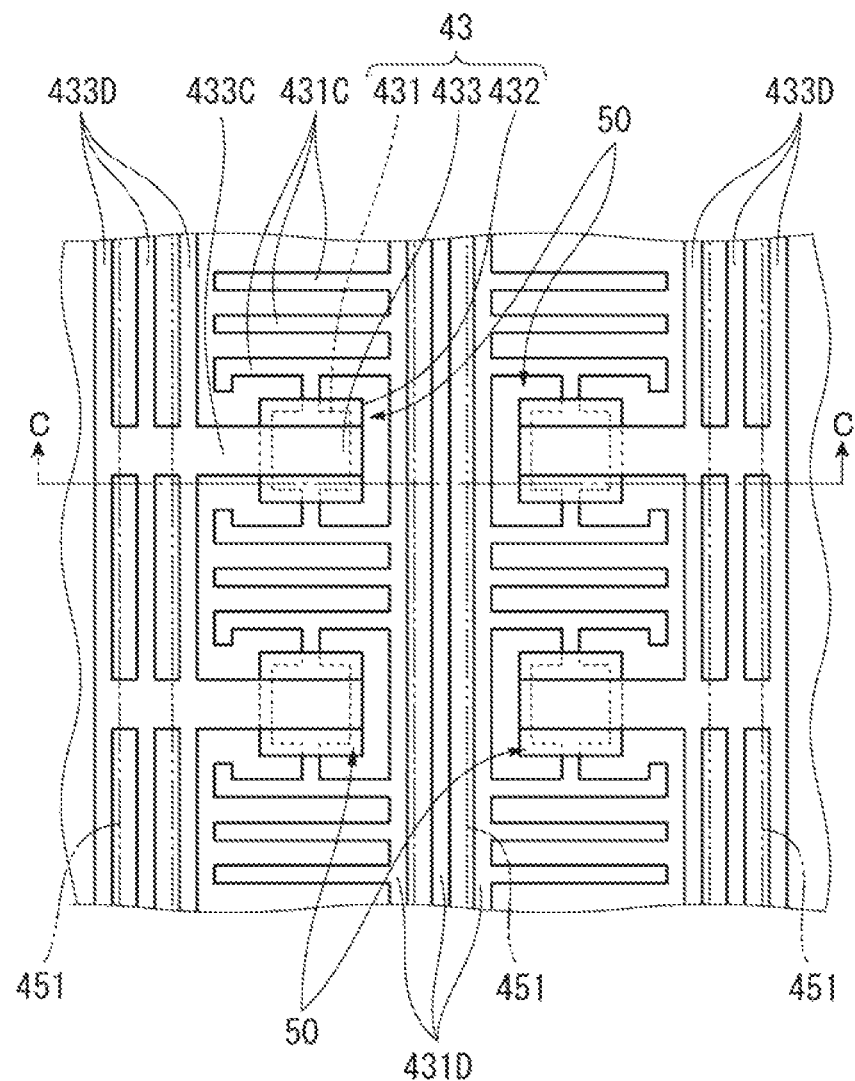
FIG. 9 is an enlarged plan view of ultrasonic transducers in an ultrasonic element in a modification.
Figure 10:
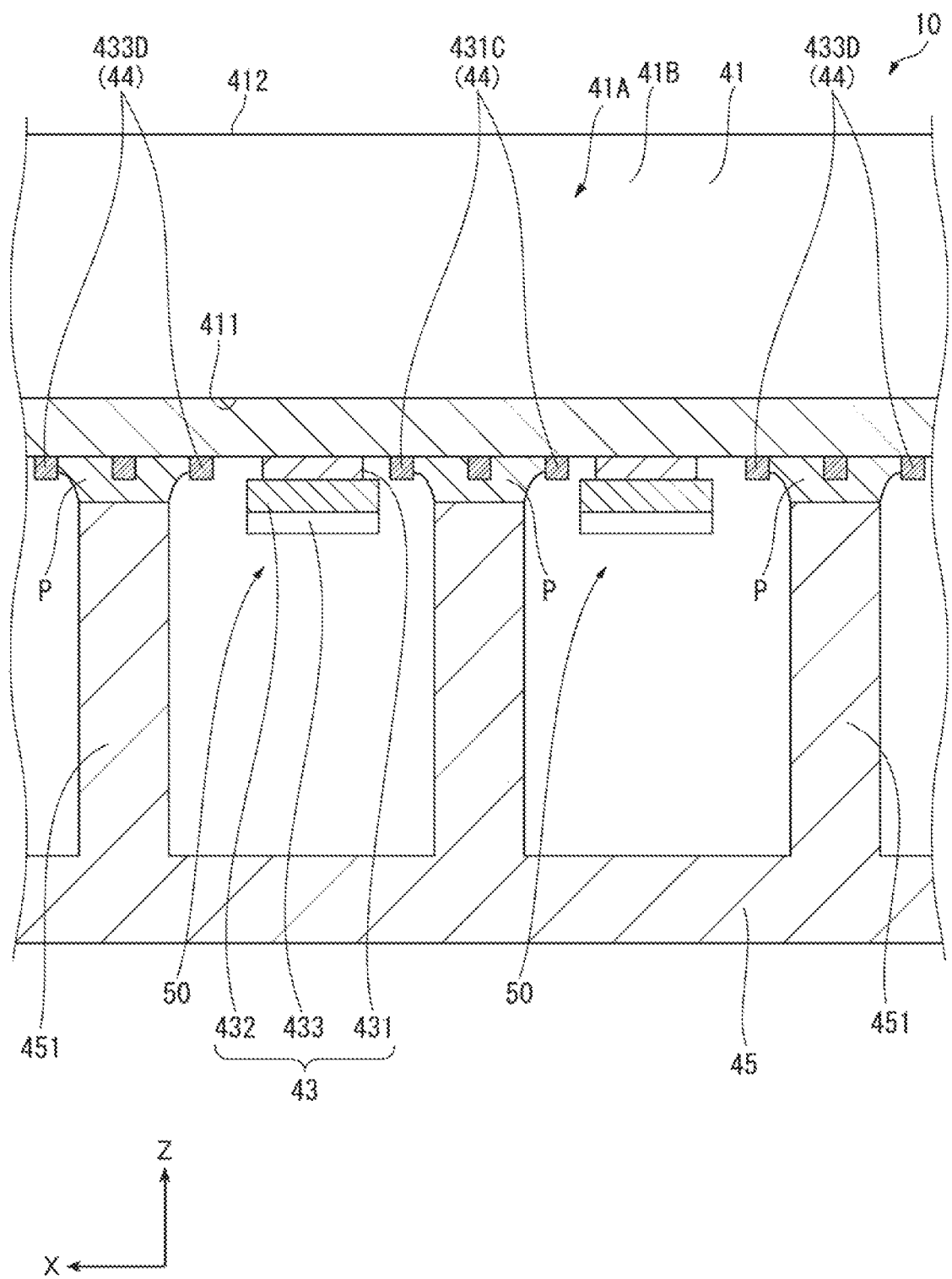
FIG. 10 is a sectional view schematically showing the ultrasonic element taken along a C-C line in FIG. 9.

FIG. 9 is an enlarged plan view of the ultrasonic transducers 50 in the ultrasonic element 10 in a modification. FIG. 10 is a sectional view schematically showing the ultrasonic element 10 taken along a C-C line in FIG. 9.

For example, as shown in FIGS. 9 and 10, an upper electrode draw-out wire 433C and upper electrode coupling wires 433D may be coupled to the upper electrode 433. The upper electrode coupling wires 433D are formed of a conductive material and configured as bundle wires obtained by binding three wires. In a cross section viewed from the Y direction, the upper electrode coupling wires 433D disposed on both sides in the ±X direction are disposed between beam sections 451 and the piezoelectric element 43. Similarly, among the lower electrode coupling wires 431D configured by three wires, the lower electrode coupling wires 431D disposed on both sides in the ±X direction are disposed between the beam sections 451 and the piezoelectric element 43. That is, the wall sections 44 that dam the flowing-out adhesive members P may be configured as a part of the upper electrode coupling wires 433D and the lower electrode coupling wires 431D functioning as bypass wires.

In the embodiment, the configuration is illustrated in which the beam sections 451 are provided between the ±X-side end portions in the array region Ar. However, the present disclosure is not limited to this.

The beam sections 451 may be longitudinally provided in the X direction across a predetermined number of opening sections 41A among the plurality of opening sections 41A provided in the X direction.

For example, the beam sections 451 may be provided from the partition wall sections 41B disposed on the −X side of one opening section 41A to the partition wall sections 41B disposed on the +X side of the opening section 41A. In this case, a plurality of beam sections 451 are provided with respect to the X direction.

In the embodiments, the distance measuring device 1 is illustrated as an example of the ultrasonic device. However, the present disclosure is not limited to this. For example, the present disclosure can also be applied to, for example, an ultrasonic measuring device that measures an internal tomographic image of a structure according to a transmission and reception result of ultrasound.

Besides, a specific structure in carrying out the present disclosure may be configured by combining the embodiments and the modifications as appropriate in a range in which the object of the present disclosure can be achieved or may be changed to other structures and the like as appropriate.

What is claimed is:

1. An ultrasonic element comprising:
an element substrate including a first surface and a second surface that are outwardly opposite to each other along a first direction, an opening piercing through the element substrate from the first surface to the second surface, and a partition wall surrounding the opening;
a supporting film provided on the first surface of the element substrate to cover the opening, the supporting film including a third surface and a fourth surface that are outwardly opposite to each other along the first direction, the third surface facing the opening and the first surface of the element substrate;
a piezoelectric element having a piezoelectric film and first and second electrodes, the first electrode of the piezoelectric element being provided on the fourth surface of the supporting film, the piezoelectric film and the second electrode being disposed on the first electrode at a region overlapping the opening of the element substrate when viewed along the first direction;
a sealing plate having a plurality of beams projecting toward the supporting film and a space located between adjacent beams of the plurality of beams, the sealing plate being provided to the opposed to the fourth surface of the supporting film and joined to the supporting film by an adhesive member; and
a wall that is plate-shaped, the wall extending along the first direction,
wherein a bottom of the wall is disposed on the first electrode, the wall is spaced apart from the plurality of beams of the sealing plate, and the wall is spaced apart from the piezoelectric film and the second electrode of the piezoelectric element, and
a top of the wall exposes to the space of the sealing plate.

2. The ultrasonic element according to claim 1, wherein the adhesive member is disposed from one of the plurality of beams to the wall.

3. The ultrasonic element according to claim 1, further comprising a supporting wall provided on the fourth surface of the supporting film and projecting toward one of the plurality of beams long the first direction, wherein the one the plurality of beams and the supporting wall are joined by the adhesive member.

4. The ultrasonic element according to claim 1, further comprising a bypass wire coupled to the first electrode of the piezoelectric element, wherein the wall is configured by a part of the bypass wire.

5. An ultrasonic device comprising:

an ultrasonic element, the ultrasonic element including:

an element substrate including a first surface and a second surface that are outwardly opposite to each other along a first direction, an opening piercing through the element substrate from the first surface to the second surface, and a partition wall surrounding the opening;

a supporting film provided on the first surface of the element substrate to cover the opening, the supporting film including a third surface and a fourth surface that are outwardly opposite to each other along the first direction, the third surface facing the opening and the first surface of the element substrate;

a piezoelectric element having a piezoelectric film and first and second electrodes, the first electrode of the piezoelectric element being provided on the fourth surface of the supporting film, the piezoelectric film and the second electrode being disposed on the first electrode at a region overlapping the opening of the element substrate when viewed along the first direction;

a sealing plate having a plurality of beams projecting toward the supporting film and a space located between adjacent beams of the plurality of beams, the sealing plate being provided to the opposed to the fourth surface of the supporting film and joined to the supporting film by an adhesive member via the plurality of beams; and a wall that is plate-shaped, the wall extending along the first direction; and a driving circuit configured to input a driving signal to the piezoelectric element, wherein a bottom of the wall is disposed on the first electrode, the wall is spaced apart from the plurality of beams of the sealing plate, and the wall is spaced apart from the piezoelectric film and the second electrode of the piezoelectric element, and a top of the wall exposes to the space of the sealing plate.

* * * * *